(12) United States Patent  
Ramm

(10) Patent No.: US 10,174,416 B2  
(45) Date of Patent: Jan. 8, 2019

(54) CHROMIUM-BASED OXIDATION PROTECTION LAYER

(71) Applicant: Oerlikon Surface Solutions AG, Trübbach, Trübbach (CH)

(72) Inventor: Juergen Ramm, Maienfeld (CH)

(73) Assignee: Oerlikon Surface Solutions AG, Pfäffikon, Pfäffikon (CH)

( * ) Notice: Subject to any disclaimer, the term of this patent is extended or adjusted under 35 U.S.C. 154(b) by 312 days.

(21) Appl. No.: 14/784,853

(22) PCT Filed: Apr. 14, 2014

(86) PCT No.: PCT/EP2014/000991  
§ 371 (c)(1),  
(2) Date: Oct. 15, 2015

(87) PCT Pub. No.: WO2014/170005  
PCT Pub. Date: Oct. 23, 2014

(65) Prior Publication Data  
US 2016/0060746 A1    Mar. 3, 2016

Related U.S. Application Data

(60) Provisional application No. 61/812,350, filed on Apr. 16, 2013.

(51) Int. Cl.  
*C23C 14/06* (2006.01)  
*C23C 14/08* (2006.01)  
(Continued)

(52) U.S. Cl.  
CPC ...... *C23C 14/0641* (2013.01); *C23C 14/0676* (2013.01); *C23C 14/081* (2013.01);  
(Continued)

(58) Field of Classification Search  
None  
See application file for complete search history.

(56) References Cited

U.S. PATENT DOCUMENTS 6,517,959 B1    2/2003  Beele  
2008/0193782 A1*  8/2008  Ramm ............... C23C 14/024  
428/469

(Continued)

FOREIGN PATENT DOCUMENTS

CN    102268637 A    12/2011  
CN    102650036 A     8/2012  
(Continued)

*Primary Examiner* — David Sample  
*Assistant Examiner* — Nicole T Gugliotta

(57) ABSTRACT

A chromium-based oxidation protection layer for substrates that are subjected to high temperatures in which the layer includes a chromium-containing layer system that has a base layer and a functional layer, the base layer is situated between the substrate and the functional layer, the base layer contains at least mostly chromium nitride, and the functional layer contains chromium oxide. According to certain embodiments, the chromium-containing layer system has a functional layer having a multilayer structure that includes alters deposited individual layers A and B, the composition of the individual layers A differs from the composition of the individual layers B, the individual layers A contain at least mostly aluminum chromium nitride or chromium nitride, and the individual layers B contain at least mostly aluminum chromium oxide or chromium oxide or aluminum chromium oxynitride or chromium oxynitride.

6 Claims, 2 Drawing Sheets

(51) Int. Cl.
*C23C 28/04* (2006.01)
*C23C 28/00* (2006.01)
*C23C 14/34* (2006.01)
*C23C 14/32* (2006.01)

(52) U.S. Cl.
CPC .......... *C23C 14/083* (2013.01); *C23C 14/325* (2013.01); *C23C 14/34* (2013.01); *C23C 28/042* (2013.01); *C23C 28/044* (2013.01); *C23C 28/322* (2013.01); *C23C 28/34* (2013.01); *C23C 28/347* (2013.01); *C23C 28/3455* (2013.01); *C23C 28/42* (2013.01); *C23C 28/44* (2013.01)

(56) References Cited

U.S. PATENT DOCUMENTS

| | | | |
|---|---|---|---|
| 2011/0299996 A1* | 12/2011 | Uihlein | C23C 30/00 416/241 R |
| 2015/0331311 A1* | 11/2015 | Kominato | G03F 1/50 430/5 |

FOREIGN PATENT DOCUMENTS

| | | |
|---|---|---|
| DE | 102005061060 A1 | 6/2007 |
| DE | 102009035841 A1 | 2/2011 |
| JP | 2008533310 A | 8/2008 |
| JP | 2010506049 A | 2/2010 |
| JP | 2010229463 A | 10/2010 |
| WO | 9923277 A1 | 5/1999 |

* cited by examiner

CHROMIUM-BASED OXIDATION PROTECTION LAYER

FIELD OF THE INVENTION

The present invention relates to a chromium-based oxidation protection layer for substrates that is subjected to high temperatures.

BACKGROUND OF THE INVENTION

According to DE 102005061060, oxidation protection layers are used, for example, in gas turbine components, gas turbine blades, plates of combustion chambers, or the like. It describes how layers are deposited from a suspension onto the substrates by means of so-called plasma spraying. Layers deposited in such a way, however, have the disadvantage that they can only be applied in relatively thick layers and also have stresses that can have a negative impact on the adhesion capability. Materials that are oxidation-resistant and have poor thermal conductivity are, however, also used in connection with pistons, as disclosed, for example, in DE10 2009 035841.

There is thus a need for layers that offer a good oxidation protection for substrates that are subjected to high temperatures during use.

The object of the present invention, therefore, is to disclose such layers and methods for producing them.

SUMMARY OF THE INVENTION

According to the invention, the object is attained by means of a chromium-containing layer system. The chromium can be in the form of metallic chromium or in compounds such as chromium oxide and/or chromium nitride. The layer and/or layer system can include other chemical elements such as aluminum, in either metallic or compound form. Preferably, an intermediate layer is first deposited on the substrate and then a top layer is deposited onto the intermediate layer.

The layer system is deposited by being precipitated from the gas phase. For example, PVD and/or CVD processes can be used for this, it is also possible to apply one part of the layers of the layer system by means of PVD and the other part of the layers of the layer system by means of CVD. For example, sputtering and/or vaporization under vacuum conditions can be used for the PVD process. A particularly preferable form of vaporization is arc vaporization in which material is locally vaporized from a target surface by means of an arc.

DETAILED DESCRIPTION OF THE PREFERRED EMBODIMENTS

The invention will now be described in detail based on several examples.

According to a first embodiment, a CrN intermediate layer 3 μm thick is applied to the substrate, onto which an AlCrO layer 3 μm thick is applied.

According to the present invention, the AlCrO layer can also be deposited as a multilayered coating, for example can be deposited with different compositions for the individual layers.

According to a second embodiment for of the present invention, a CrN intermediate layer 3.5 μm thick is applied to the substrate, onto which an AlCrO layer 3.5 μm thick is applied.

According to a third embodiment for of the present invention, a CrN intermediate layer 1.7 μm thick is applied to the substrate, onto which an AlCrO layer 1.7 μm thick is applied.

According to a fourth embodiment for of the present invention, a CrN intermediate layer 5 μm thick is applied to the substrate, onto which a CrO/N multilayer (CrO/CrN multilayer) 5 μm thick is applied.

In the above-mentioned embodiments, the coating temperature can be 450° C., for example.

Figure 1:
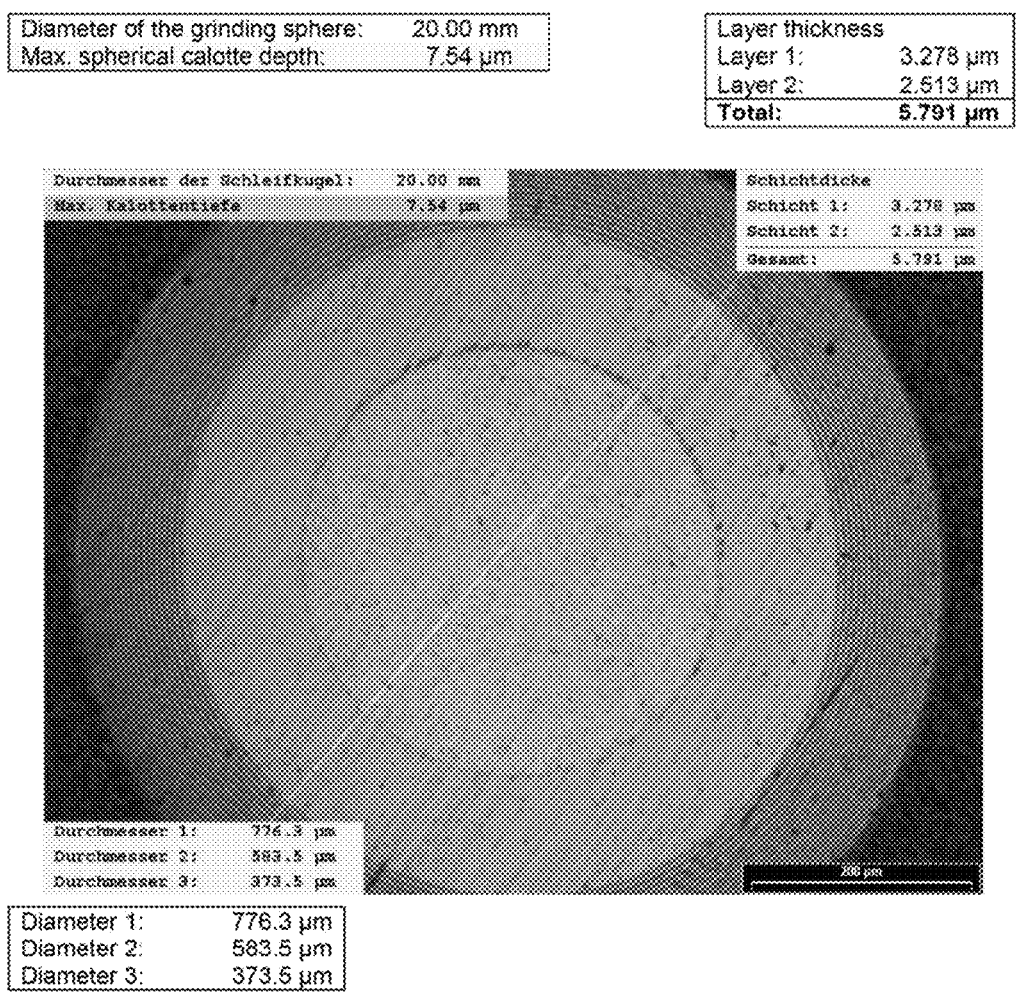
FIG. 1 shows a spherical calotte grinding of a chromium-containing layer system.
Figure 2:
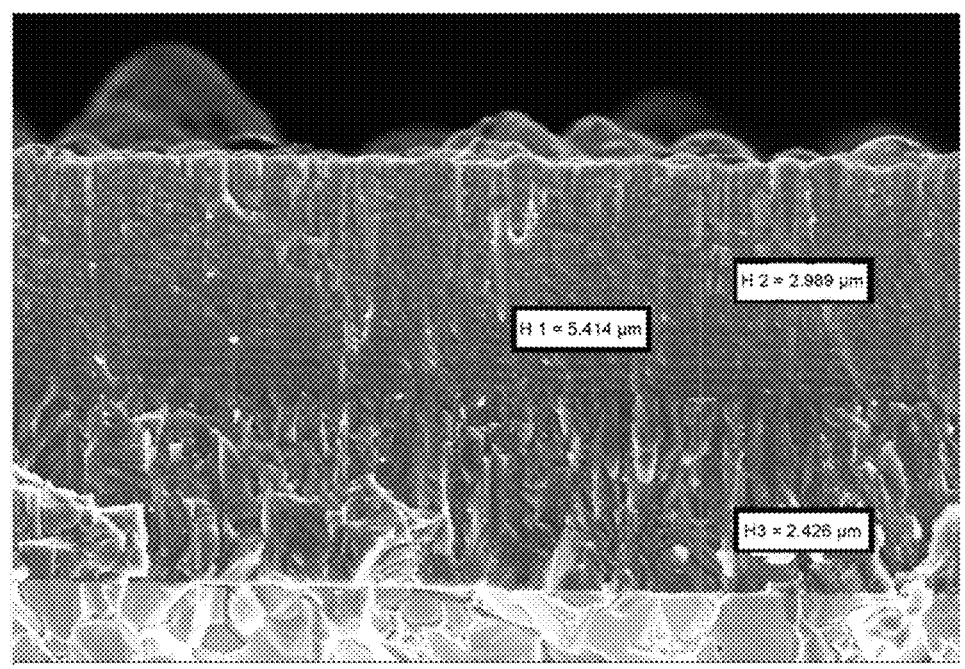
FIG. 2 is an electron microscope image of the layer system of FIG. 1.

According to a fifth and preferred embodiment, a CrN intermediate layer is applied to the substrate, onto which a CrN/CrON multilayer is applied (in this regard, see the spherical calotte grinding shown in FIG. 1). As is clear from the electron microscope image in FIG. 2, the thickness of the CrN intermediate layer is approx. 2.4 μm and the thickness of the multilayer is approx. 3 μm.

The multilayer in the example is a multilayer composed of 36 individual layers, 18 of which are CrN individual layers and 18 of which are CrON individual layers (see FIG. 1). For application of the layers, it took approximately 2 minutes to apply each individual layer so that it took about 72 minutes to produce the multilayer coating. During the coating process, a coating temperature of approx. 230° C. was maintained. In this connection, the number of individual layers and their thicknesses can be selected to match the application. The result is a thin, highly resistant protective layer that protects against oxidation, which is suitable among other things for substrates that are subjected to high temperatures during use and that require protection from oxidation.

In the examples, CrN was used as an intermediate layer. According to the invention, however, it is also possible to use other layers as intermediate layers, for example metallic chromium. It is also possible to first apply metallic chromium to the substrate surface, followed by a thicker CrN layer onto which a CrN/CrON multilayer is then applied, which is composed of thinner individual layers.

The invention has disclosed a chromium-based oxidation protection layer for substrates that are subjected to high temperatures in which the layer includes a chromium-containing layer system that has a base layer and a functional layer, the base layer is situated between the substrate and the functional layer, the base layer contains at least mostly chromium nitride, and the functional layer contains chromium oxide.

According to a preferred embodiment of the present invention, the base layer is composed of chromium nitride, but can also be composed of aluminum chromium nitride for some applications.

According to another embodiment, the functional layer contains at least mostly aluminum chromium oxide or preferably, the functional layer is composed of aluminum chromium oxide.

According to a particularly preferred embodiment, the functional layer has a multilayer structure that includes alternatingly deposited individual layers A and B, and the composition of the individual layers A differs from the composition of the individual layers B.

The layer thickness of the base layer is preferably greater than 1 µm, for some applications preferably between 1.5 and 10 µm, or even more preferably between 2 µm and 7 µm.

The ratio between the layer thickness of the functional layer and the layer thickness of the base layer is preferably between 0.5 and 2, or for some applications, preferably between 0.25 and 1.5.

Another oxidation protection layer according to the invention is a chromium-based oxidation protection layer for substrates that are subjected to high temperatures in which the layer includes a chromium-containing layer system that has a functional layer, the functional layer has a multilayer structure, which has alternatingly deposited individual layers A and B and in which the composition of the individual layers A differs from the composition of the individual layers B, the individual layers A contain at least mostly aluminum chromium nitride or preferably chromium nitride, and the individual layers B contain at least mostly aluminum chromium oxide or chromium oxide or preferably aluminum chromium oxynitride or even more preferably chromium oxynitride.

In general, according to the present invention, the individual layers A contain at least mostly aluminum chromium nitride or preferably chromium nitride and the individual layers B contain at least mostly aluminum chromium oxide or chromium oxide or preferably aluminum chromium oxynitride or even more preferably chromium oxynitride.

According to other preferred embodiments of an oxidation layer according to the present invention:
the individual layers A are composed of aluminum chromium nitride and the individual layers B are composed of aluminum chromium oxide or preferably of aluminum chromium oxynitride, or
the individual layers A are composed of chromium nitride and the individual layers B are composed of aluminum chromium oxide or preferably of aluminum chromium oxynitride, or particularly preferably
the individual layers A are composed of chromium nitride and the individual layers B are composed of chromium oxide or preferably of chromium oxynitride.

The multilayer structure can also have an individual layer C that is deposited between an individual layer A and an individual layer B, the composition of the individual layer C differs respectively from the composition of the individual layer A and from the composition of the individual layer B, and the individual layer C contains at least mostly aluminum chromium oxynitride or preferably chromium oxynitride.

Preferably, such an individual layer C is composed of aluminum chromium oxynitride or more preferably of chromium oxynitride.

According, to a preferred embodiment, between each individual layer A and individual layer B that are deposited on top of one another in alternation, the multilayer structure has an individual layer C whose nitrogen content is greater than the nitrogen content in the directly adjacent individual layer B and less than the nitrogen content in the directly adjacent individual layer A.

The layer thickness of each individual layer A and/or B is preferably between 50 nm and 100 nm.

The disclosure also includes a coated substrate with an oxidation layer according to one of the above-described embodiments of the present invention.

Furthermore, the disclosure includes a method for producing an oxidation layer according to the above-described embodiments of the present invention in which preferably, the method is a PVD process such as a sputtering process or for some applications, preferably an arc vaporization process. Preferably, the process temperature during the coating process is not higher than 450° C.

The invention claimed is:

1. A chromium-based oxidation protection layer for substrates, the layer comprising:
a chromium-containing layer system that has a base layer and a functional layer and the base layer is situated between a substrate and the functional layer, wherein the base layer consists essentially of chromium nitride and the functional layer has a multilayer structure that includes alternatingly deposited individual layers A and B, the individual layers A consist essentially of chromium nitride and the individual layers B consist essentially of chromium oxide or chromium oxynitride, wherein a layer thickness of each individual layer A and/or B is between 50 nm and 100 nm.

2. The oxidation protection layer according to claim 1, wherein a layer thickness of the base layer is greater than 1 µm.

3. The oxidation protection layer according to claim 1, wherein a ratio between, a layer thickness of, the functional layer and a layer thickness of the base layer is between 05 and 2.

4. A chromium-based oxidation protection layer for substrates, the layer comprising:
a chromium-containing layer system that has a functional layer, wherein the functional layer has a multilayer structure that includes alternatingly deposited individual layers A and B, a composition of the individual layers A differs from a composition of the individual layers B, the individual layers A consist essentially of chromium nitride, and the individual layers B consist essentially of chromium oxide or chromium oxynitride, wherein a layer thickness of each individual layer A and/or B is between 50 nm and 100 nm.

5. A coated substrate comprising an oxidation layer according to claim 1.

6. The oxidation protection layer according to claim 1, wherein between each individual layer A and individual layer B that are deposited on top of one another in alternation, the multilayer structure has an individual layer C whose nitrogen content is greater than a nitrogen content in a directly adjacent individual layer B and less than a nitrogen content in a directly adjacent individual layer A.

* * * * *